United States Patent [19]
Lerner et al.
[11] 3,984,291
[45] Oct. 5, 1976

[54] ELECTRODEPOSITION OF TIN-LEAD ALLOYS AND COMPOSITIONS THEREFOR

[75] Inventors: Lewis Brian Lerner, Linglestown; Thomas Francis Davis, Harrisburg, both of Pa.

[73] Assignee: AMP Incorporated, Harrisburg, Pa.

[22] Filed: Oct. 14, 1975

[21] Appl. No.: 621,998

[52] U.S. Cl............................. 204/43 S; 204/DIG. 2
[51] Int. Cl.[2]............................................ C25D 3/60
[58] Field of Search.................. 204/43 S, 53, 54 L, 204/123, DIG. 2

[56] References Cited

FOREIGN PATENTS OR APPLICATIONS 217,850 7/1968 U.S.S.R. ............................ 204/54 L

OTHER PUBLICATIONS

Abner Brenner, "Electrodeposition of alloys", vol. II, pp. 4–29, (1963).

J. Vaid, et al., J. Electrochem. Soc., vol. 104, pp. 460–461, (1957).

*Primary Examiner*—G. L. Kaplan
*Attorney, Agent, or Firm*—Russell J. Egan

[57] ABSTRACT

A process, an electrolyte for electrodepositing tin-lead alloys from an aqueous bath, and a salt composition as a solid material adapted for mixing with aqueous solution to effect plating of tin-lead alloys from an electrolyzed bath solution; the bath used is an aqueous solution comprising tin metal salt, such as in the form of stannous pyrophosphate, potassium pyrophosphate, sodium potassium tartrate, and lead as lead pyrophosphate, lead chloride, lead tartrate, or lead acetate; the pH of the bath is from 8.0–9.0 and up to 10.0 and the operating temperature is from 75 to 150°F, the bath is operated with agitation and the anodes are preferably solid tin-lead anodes.

4 Claims, No Drawings

ELECTRODEPOSITION OF TIN-LEAD ALLOYS AND COMPOSITIONS THEREFOR

This invention relates to a method for producing tin-lead alloys by electrolytic deposition permitting a controlled deposition of tin and lead over wide variations. The novel bath deposits the alloy in an advantageous manner without requiring the use of fluorides of fluoroborates. The last two constituents cause considerable waste treatment problems because fluorides must be removed in some states to point where the effluent contains 1 part per million. Therefore, fluoride baths are undesirable under the increasing strict pollution requirements. Moreover, the present invention relates to an advantageous method for depositing tin-lead alloys in a wide proportion of lead to tin over an operating temperature and at pH conditions leading to a less corrosive environment in a plating bath. Still further, the present invention also relates to the salt composition as a solid material adopted for packaging and mixing with an aqueous solution for make-up of a bath or for start-up of a bath solution to achieve plating of tin-lead alloys from an electrolyzed bath solution.

BACKGROUND FOR THE INVENTION

In the electrodeposition of tin and lead, many methods have been proposed which have, in general, evolved towards methods based on depositing these two metals as alloys from what is known as a fluoride or a fluoroborate bath. These alloys so deposited provide all the advantages for soldering associated with tin such as in printed circuitry and other circuits wherever a tin overplate is needed to achieve better soldering properties. Further, fluoride baths are used to obtain circuit boards with 93 percent tin to 7 percent lead deposits as a replacement for pure tin deposits. The later are subject to whisker growth and thus cause short circuiting across closely spaced circuit patterns. Because of these advantages, the fluoride and fluoroborates have substantially dominated the tin-lead plating bath without serious competition being offered by any other bath for depositing tin-lead alloys.

However, various disadvantages have become increasingly evident when using the fluoride and fluoroborate bath for depositing tin-lead alloys. First, the above-mentioned waste treatment is very complicated for fluorides and fluoroborates and the treatment requirements have become increasingly strict to a point where the economic benefits are now questionable.

Inasmuch as the plating equipment is severly corroded by the fluoride and fluoroborate bath, the various shortcomings have prompted a search for a replacement bath having all the advantages but as few disadvantages as possible.

Although various methods have been proposed for coating electrodeposition lead such as lead and antimony in U.S. Pat. No. 2,718,494 or tin and antimony in U.S. Pat. No. 2,825,683 as well as various coatings of lead at a pH of about 8 and tin at a pH of about 1, for example in U.S. Pat. No. 2,919,233, the use of a method for depositing tin-lead alloys in controlled conditions has not been disclosed from a bath of the present composition.

Other bath solutions which have been disclosed such as in U.S. Pat. No. 3,039,942 provide for a complicated method of electrodepositing from solutions which are based on pyrophosphates but are not of the composition disclosed in the present process. These compositions are subject to rapid variations in deposit composition and are very hard to control because powdery deposits are often produced. Other baths which describe nonanalogous tin alloys have been reported in Bull. India Sect., Electrochem. Soc., Vol. 9, pp. 13 to 14, (1960).

DESCRIPTION OF THE INVENTION AND THE PREFERRED EMBODIMENTS

It has now been found that an electroplating bath for tin-lead alloys based on pyrophosphate and Rochelle salts has been found which not only simplifies waste treatment, but simplifies effluent control of lead as well as provides a less corrosive plating environment from the environment associated with fluoride and fluoroborate bath now in use.

Still further, it has now been discovered that the new combination of the electrolyte bath provides controllable amounts of tin-lead alloys in a range of 1 to 40 percent of lead as a percent of the total metal in the tin-lead alloy deposit obtainable from the novel bath. Still further, it has also been found that the salt composition as a storage stable solid, when admixed with water, can be readily started as a bath or incorporated in a bath to obtain the desired aqueous electrolyzable bath.

The electrolytic bath is prepared by dissolving tin metal generally as a stannous pyrophosphate in an amount (based on the elemental metal) from 7.5 to 75 grams per liter (1 to 10 ounces per gallon); potassium pyrophosphate ($K_4P_2O_7$) in an amount from 100 to 400 grams per liter (10 to 50 ounces per gallon) sodium pyrophosphate is useful but less advantageous; and Rochelle salts (NaK tartrate) in amounts from 50 to 300 grams per liter (5 to 40 ounces per gallon); and lead metal incorporated in the form of a lead salt preferably as lead tartrate or lead pyrophosphate, based as percent of total metal in the bath and in an amount from 1 to 40 percent. Other lead salts are lead acetate or lead chloride, but these salts are vastly less desirable. As it is evident, the above concentrations are dependent upon the alloy composition desired; but considerable variations in the operating conditions can take place before the deposit changes its constitution other than based on the metal to metal concentration in the bath.

Still further, the electrolytic bath is operated at a pH from about 8.0 to 10 but the most preferred and desirable range to which this process is essentially confined is 8.5 to 9.0. Operating temperatures can range from the 75° to 150°F. At increasing temperatures the stability of the pyrophosphate decreases somewhat and hence, the desired temperature range is at a range from 80° – 120°F. The proportions of the metal in the bath and hence, the alloy in a broader range can vary from 1:99 to 99:1 tin to lead. The 93:7 and 60:40 tin to lead alloy compositions are the preferred compositions.

In addition to tin being used as stannous pyrophosphate in the above described bath, it may be used in the form of the following salts: tin tartrate, tin chloride, tin bromide, etc. (but the last two are not the preferred salts). Similarly, lead may be employed as the following salts: lead pyrophosphate, lead acetate, lead tartrate, or less desirably, lead chloride, or lead bromide, etc.

In the above ranges, the grams per liter base is predicated on the two alloy components as the elemental metal portion of the salt, thus, in each case, the base is the elemental metal.

The effluent control of lead is achieved in a simplified manner by precipitating lead as sulfate. In general, the prior art bath using the fluoride and the fluoroborates are operated at a pH of 0.5 to 4.0, hence, the corrosiveness of the prior bath is readily evident from the pH measure above whereas the present bath is virtually non-corrosive.

In accordance with the above described composition, the salts may be compounded for the ready sale for dilution in a bath and plating of the tin-lead alloys. The salt proportions can either be based on the grams per liter basis as indicated above or can be based on the ounces per gallon basis. In any event, the dilutable proportions of these components when incorporated in the bath should fall within the indicated ranges or substantial equivalents thereof.

The Rochelle salt is calculated on the basis of the pure salt. Pure potassium tartrate or sodium tartrate or mixtures thereof may also be used. Similarly, the potassium pyrophosphate (or the less desirable sodium or ammonium pyrophosphate) is calculated on the basis of the nonhydrated form.

In general, pH adjustment is achieved by adding pyrophosphoric acid or potassium hydroxide (or sodium hydroxide salts if sodium salts are used in the baths).

With respect to the above bath, the plating is carried out by electrolyzing the bath solution at an effective plating current of 5 to 80 ASF (amperes per square foot). Prior art baths at 15 ASF pyrophosphate produce powdery deposits. A preferred range of current in ASF is from 20 to 40 in a rack, barrel, or stripline plating bath.

The obtained electrodeposited alloys have excellent solderability properties as tested by contact angle, meniscus graph; area of spread, etc. tests as well as excellent adhesion to the underplate which may be such as copper or copper alloys.

With respect to the following example, the illustrative process conditions as well as the plating conditions are shown for an electrodeposition of the alloy, merely to illustrate the invention and not to limit the same.

EXAMPLE 1

A bath comprising of 30 grams per liter of tin, 2 grams per liter of lead, and 200 grams per liter of potassium pyrophosphate, and 200 grams per liter of Rochelle salt was run at a pH of 8.5 and a temperature of 100°F at a current density of about 20 to 40 ASF. Generally, beryllium-copper or phosphor bronze terminals or substrates were plated with the above composition. Brass advantageously is underplated with copper (because of zinc).

What is claimed is:

1. A method for depositing tin-lead alloys from an aqueous electrolyte solution comprising electrolyzing said solution containing from 7.5 to 75 grams per liter of tin based on elemental metal, potassium, sodium, or ammonium pyrophosphate from 100 to 400 grams per liter; Rochelle salts, sodium or potassium tartrate from 50 to 300 grams per liter; lead based on elemental metal and as percent of tin metal 1 to 99 percent, said solution being at a pH of 8.0 to 10.0 at a temperature from 75°F to 150°F; and depositing said tin-lead alloy on a work piece and recovering said work piece.

2. An aqueous electrolyte suitable for deposition of tin-lead alloys from said electrolyte, said aqueous electrolyte comprising: tin as pyrophosphate, wherein said amount of tin in said solution based on elemental metal is from 7.5 to 75 grams per liter of said solution; potassium, sodium, or ammonium pyrophosphate from 100 to 400 grams per liter; sodium-potassium tartrate, sodium tartrate, potassium tartrate or mixtures thereof from 50 to 300 grams per liter; lead as a dissolved salt as percent of dissolved tin in said solution from 1 to 99 percent, and wherein the pH of said solution is from 8.0 to 10.

3. The aqueous electrolyte as defined in claim 2 wherein the same comprises 30 grams per liter of tin, 2 grams per liter of lead, 200 grams per liter of potassium pyrophosphate, and 200 grams per liter of Rochelle salt.

4. A storage stable solids composition for use to make an electrolyte for the electrodeposition of a tin-lead alloy consisting essentially of a water soluble tin salt, potassium, sodium, or ammonium pyrophosphate; Rochelle salt; sodium tartrate, potassium tartrate or mixtures thereof; and a water soluble lead salt, wherein said lead on an elemental metal basis is from 1 to 99 percent based on the amount of tin as elemental metal in said composition.

* * * * *